(12) United States Patent
Rofougaran et al.

(10) Patent No.: US 8,295,333 B2
(45) Date of Patent: Oct. 23, 2012

(54) METHOD AND SYSTEM FOR INTER-PCB COMMUNICATION UTILIZING A SPATIAL MULTI-LINK REPEATER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1167 days.

(21) Appl. No.: 12/116,835

(22) Filed: May 7, 2008

(65) Prior Publication Data

US 2009/0279593 A1 Nov. 12, 2009

(51) Int. Cl.
*H04B 3/36* (2006.01)

(52) U.S. Cl. ........ 375/211; 375/212; 375/213; 375/214; 370/319; 370/320; 370/321; 370/330; 370/345; 370/347; 333/193; 333/192; 333/195; 333/196

(58) Field of Classification Search .......... 375/211, 375/212, 213, 214; 370/319, 320, 321, 330, 370/335, 342, 345, 347; 333/193, 192, 195, 333/196

See application file for complete search history.

(56) References Cited

U.S. PATENT DOCUMENTS

| | | | |
|---|---|---|---|
| 5,200,955 A | 4/1993 | McFarlane et al. | |
| 6,697,603 B1 * | 2/2004 | Lovinggood et al. | 455/13.1 |
| 6,731,904 B1 * | 5/2004 | Judd | 455/11.1 |
| 7,813,451 B2 | 10/2010 | Binder et al. | |
| 2006/0285510 A1 * | 12/2006 | Kim et al. | 370/312 |
| 2009/0247109 A1 | 10/2009 | Rofougaran | |
| 2009/0247213 A1 | 10/2009 | Rofougaran | |
| 2009/0278596 A1 | 11/2009 | Rofougaran et al. | |
| 2009/0280768 A1 | 11/2009 | Rofougaran et al. | |
| 2009/0316829 A1 | 12/2009 | Rofougaran | |
| 2009/0318086 A1 | 12/2009 | Rofougaran | |
| 2010/0159859 A1 | 6/2010 | Rofougaran | |

* cited by examiner

*Primary Examiner* — Zewdu Kassa
(74) *Attorney, Agent, or Firm* — Farjami & Farjami LLP (57) ABSTRACT

Aspects of a method and system for inter-PCB communication utilizing a spatial multi-link repeater are provided. In this regard, a signal may be transmitted between printed circuit boards via one or more repeaters, wherein the repeaters may frequency shift received signals to generate repeated signals. Each of the repeated signals may be generated by quadrature down-converting said received signal by mixing the received signal with a first LO signal pair, up-converting the down-converted signal by mixing it with a second LO signal pair, and adding or subtracting an in-phase portion and a quadrature-phase portion of the up-converted signal. Each repeated signal may comprise one or more signal components and a phase and/or amplitude of each of the components may be controlled to control a directivity of the repeated signals. The repeater may reside on one of the plurality of printed circuit boards.

22 Claims, 4 Drawing Sheets

METHOD AND SYSTEM FOR INTER-PCB COMMUNICATION UTILIZING A SPATIAL MULTI-LINK REPEATER

CROSS-REFERENCE TO RELATED APPLICATIONS/INCORPORATION BY REFERENCE

This patent application makes reference to:
U.S. patent application Ser. No. 12/057,780, filed on Mar. 28, 2008, now published as U.S. patent application publication 2009/0247109;
U.S. patent application Ser. No. 12/058,077, filed on Mar. 28, 2008, now published as U.S. patent application publication 2009/0247075;
U.S. patent application Ser. No. 12/116,581 filed on May 7, 2008 ,now published as U.S. patent application publication 2009/0278596; and
U.S. patent application Ser. No. 12/116,763 filed on May 7, 2008, now published as U.S. patent application publication 2009/0280768.

Each of the above stated applications is hereby incorporated herein by reference in its entirety.

FIELD OF THE INVENTION

Certain embodiments of the invention relate to signal processing. More specifically, certain embodiments of the invention relate to a method and system for inter PCB communication utilizing a spatial multi-link repeater.

BACKGROUND OF THE INVENTION

In the rapidly evolving world of wireless communications, new protocols are continually being developed which operate at higher and higher frequencies. For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'.

In this regard, communication at extremely high frequencies (EHF) may enable reducing the size of corresponding communication systems due, for example, to the smaller passive components required. Additionally, EHF systems may enable higher data rates than their lower frequency counterparts. However, a major drawback of operating at extremely high frequencies is that EHF signals have substantially different characteristics in terms of signal propagation than lower frequency signals. In this regard, EHF signals may only be suited for "line-of-site".

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for inter-PCB communication utilizing a spatial multi-link repeater, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for inter-PCB communication utilizing a spatial multi-link repeater. In this regard, a signal may be transmitted between printed circuit boards via one or more repeaters, wherein the repeaters may frequency shift received signals to generate repeated signals. Each of the repeated signals may be generated by quadrature down-converting said received signal by mixing the received signal with a first LO signal pair, up-converting the down-converted signal by mixing it with a second LO signal pair, and adding or subtracting an in-phase portion and a quadrature-phase portion of the up-converted signal. Each repeated signal may comprise one or more signal components and a phase and/or amplitude of each of the components may be controlled to control a directivity of the repeated signals. The repeater may reside on one of the plurality of printed circuit boards.

Figure 1:
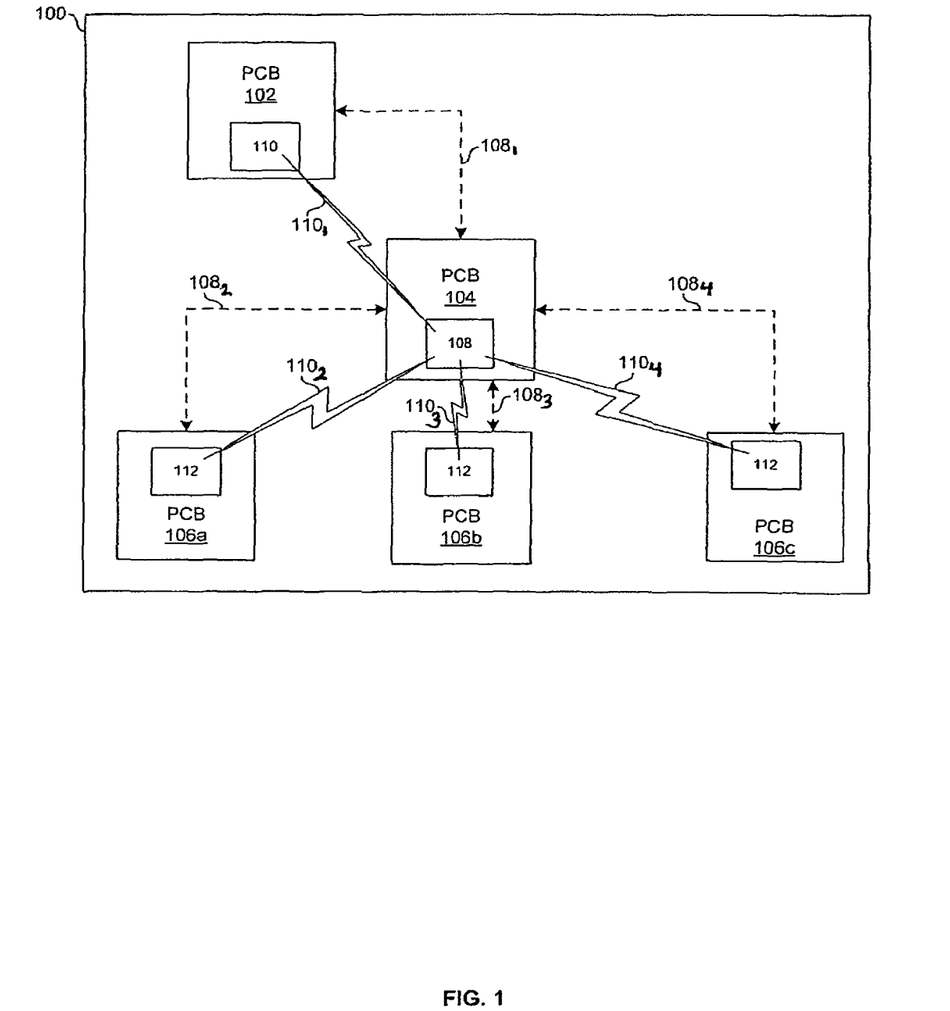
FIG. 1 is diagram of an exemplary system comprising a plurality of printed circuit boards (PCBs) which are enabled to provide inter PCB communications utilizing a spatial multilink repeater, in accordance with an embodiment of the invention.

FIG. 1 is diagram of an exemplary system comprising a plurality of printed circuit boards (PCBs) which are enabled to provide inter PCB communications utilizing a spatial multilink repeater, in accordance with an embodiment of the invention. Referring to FIG. 1 there is shown a system 100 comprising PCBs 102, 104, and 106a, 106b, 106c (collectively referred to as PCBs 106). The PCB 102 may comprise a transceiver 110, the PCBs 106 may each comprise a transceiver 112, and the PCB 104 may comprise a repeater 108.

The transceivers 110 and 112 may each comprise suitable logic, circuitry, and/or code for wirelessly transmitting and/or receiving data. The repeater 108 may comprise suitable logic, circuitry, and/or code that may enable receiving RF signals, generating a plurality of repeated signals by frequency shifting the received RF signal, and adjusting phase and/or amplitude of components of the repeated signals to control the directionality of the repeated signals. In some embodiments of the invention, one or more of the transceivers 110 and 112 may comprise suitable logic, circuitry, and/or code that may enable processing of any form of signals such as, for example, multimedia information, comprising, audio, video, and/or data. Audio may comprise voice, any form of music, and/or any form of sound. The processing of signals by the transceivers 110 and 112 may occur in analog and/or digital format. In this regard, circuit components, such as integrated circuits, discrete components, and monolithic microwave integrated circuits (MMICs), may be soldered to and/or otherwise affixed to each of the PCBs 102, 104, and 106. Accordingly, the PCBs 102, 104, and 106 may mechanically support and/or electrically couple the circuit components.

In various embodiments of the invention, the repeater 108 may be dedicated to repeating signals without extracting information from received signals. In various other embodiments of the invention, the repeater 108 may be similar to or the same as the transceivers 110 and/or 112 and may be enabled to extract information from and/or perform additional processing of received signals in addition to repeating signals.

In operation, wireless signals $110_1$, $110_2$, $110_3$ and $110_4$ may be communicated, via the transceivers 110 and 112, between the PCBs 102 and 106. For example, the PCB 102 may transmit EHF signals to the PCBs 106. However, due to the physical placement of the PCBs 102 and 106 in the system 100 and/or due to other physical obstructions between the PCBs 102 and 106, there may be no line-of-sight path for reliably communicating EHF signals. Accordingly, the PCB 104 may, via the repeater 108, re-transmit (repeat) signals received from PCB 102 to one or more of the PCBs 106. The PCBs 102 and 106 may or may not be aware of the presence of the PCB 104. Accordingly, the repeating of the signals from the IC 102 may be transparent to the operation of the IC 102 and/or the ICs 106. In some instances, a signal may be repeated multiple times before arriving at a target PCB. For example, a system similar to the system 100 of FIG. 1 may comprise a plurality of the PCB 104 and a signal from the PCB 102 may be received by a first PCB 104.sub.1 which may repeat the signal to a second PCB 104.sub.2 and the second PCB 104.sub.2 may then repeat the signal to a target PCB 106.

In operation, signals received by a repeater may be frequency shifted to generate repeated signals. In this regard, an amount of frequency shift applied to the received signal may be determined, for example, based on a transmit frequency of the PCB 102 and/or based on a receive frequency of one or more of the PCBs 106. For example, each of the PCBs 106 may receive on a different frequency and thus the frequency shift applied by PCB 104 may determine which of the PCBs 106 may receive the repeated signals. Additionally, repeated signals may comprise a plurality of signal components and a phase and/or amplitude of the signal components may be adjusted to control the directivity of the repeated signals. In this regard, attributes of the wireless signals 110 may be determined via control/configuration connections $108_1$, $108_2$, $108_3$ and $108_4$ which may be, for example, wireline connections or wireless connections utilizing a different protocol such as Bluetooth.

Figure 2:
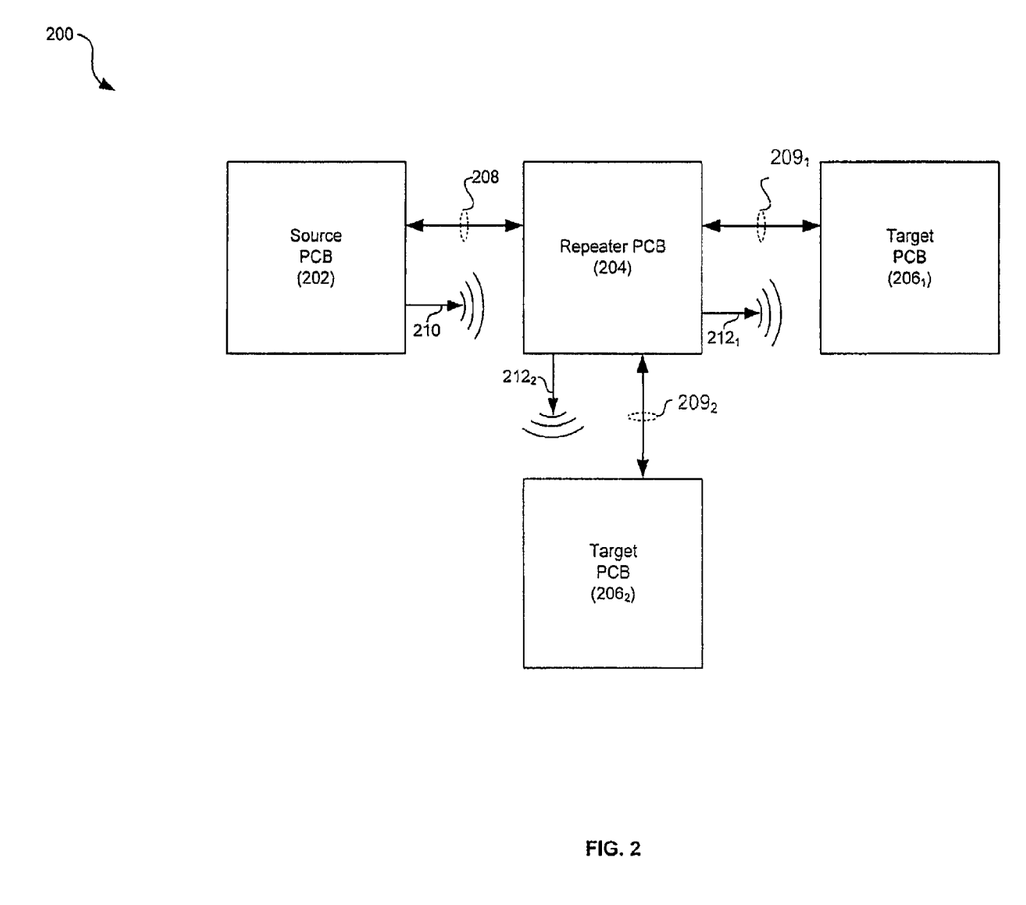
FIG. 2 is a block diagram illustrating a repeater device utilized to forward wireless communications from a source PCB to a plurality of target PCBs, in accordance with an embodiment of the invention.

FIG. 2 is a block diagram illustrating a repeater device utilized to forward wireless communications from a source PCB to a plurality of target PCBs, in accordance with an embodiment of the invention. Referring to FIG. 2, there is shown a source PCB 202; a repeater PCB 204; target PCBs $206_1, \ldots, 206_N$; transmitted signal 210, repeated signals $212_1, \ldots, 212_N$; and control connections 208a, 208b, and 208c, 208, $209_1, \ldots, 209_N$, where N may be the number of target PCBs to which the signal 210 may be repeated. The system 200 is only exemplary and other systems may comprise additional source PCBs, repeater PCBs, and/or target PCBs without deviating from the scope of the present invention. Additionally, one or more of the target PCBs $206_1, \ldots, 206_N$ may comprise suitable logic, circuitry, and/or code that may enable repeating signals.

The source PCB 202 and the target PCBs $206_1, \ldots, 206_N$ may each comprise suitable logic, circuitry, and/or code that may enable receiving, transmitting, and processing of RF signals. In this regard, one or more of the source PCB 202 and the target PCBs $206_1, \ldots, 206_N$ may enable processing of any form of signals such as, for example, multimedia information, comprising, audio, video, and/or data. Audio may comprise voice, any form of music, and/or any form of sound. The processing of signals by the PCBs 202 and 206 may occur in analog and/or digital format. Additionally, one or more antennas may be printed or etched onto each of the PCBs 202 and 206.

The repeater PCB 204 may comprise suitable logic, circuitry, and/or code that may enable reception and/or transmission of RF signals to facilitate forwarding an RF signal from the source PCB 202 to the target PCBs $206_1, \ldots, 206_N$. In this regard, the repeater PCB 204 may be configured based on information received via the control connections 208, $209_1, \ldots, 209_N$. Accordingly, directionality of the repeated signals $212_1, \ldots, 212_N$ may be controlled so as to direct the signals $212_1, \ldots, 212_N$ to the target PCBs $206_1, \ldots, 206_N$, respectively. In this regard, repeated signals $212_1, \ldots, 212_N$ may each comprise a plurality of signal components and a phase and/or amplitude of the signal components may be controlled based on the physical location of the target PCBs $206_1, \ldots, 206_N$. Additionally, a frequency of each of the repeated signals $212_1, \ldots, 212_N$ may be controlled. Also, in various embodiments of the invention, one or more antennas may be printed or etched onto the PCB 204.

In various embodiments of the invention, the PCB 204 may operate as a repeater and may be dedicated to receiving signals and repeating the received signals without extracting information from or performing additional processing on the received signals. In various other embodiments of the invention, the PCB 204 may comprise suitable logic, circuitry, and/or code that may be enable extraction of information from and/or performing additional processing of received signals in addition to repeating the received signals. In this regard, the PCB 204 may be enabled to process any form of signals such as, for example, multimedia information, comprising, audio, video, and/or data. Audio may comprise voice, any form of music, and/or any form of sound. The processing of signals by the PCB 204 may occur in analog and/or digital format.

The control connections 208, $209_1, \ldots, 209_N$ may each comprise a wireless and/or wireline link that may be utilized to communicate control messages between the source PCB 202 and the repeater PCB 204, and between the repeater PCB 204 and the target PCBs $206_1, \ldots, 206_N$, respectively. For example, the control connections 208, $209_1, \ldots, 209_N$ may be utilized to determine the target PCBs $206_1, \ldots, 206_N$ for a received signal 210, determine a receive frequency of each of the target PCBs $206_1, \ldots, 206_N$, and/or determine directionality from the repeater PCB 204 to each of the target PCBs $206_1, \ldots, 206_N$. Exemplary links may comprise a Bluetooth connection and a three wire interface.

In operation, the source PCB 202 may transmit a signal 210 destined for the target PCBs $206_1, \ldots, 206_N$. However, due to factors such as distance and/or physical obstructions, signals from the source PCB 202 may not reliably reach one or more of the target PCBs $206_1, \ldots, 206_N$. For example, extremely high frequency (EHF) communications may be limited to line-of-sight operation. Accordingly, the repeater PCB 204 may receive the signal 210, having a first frequency, from the source device 202 and repeat (re-transmit) the received signal 210 as signals $212_1, \ldots, 212_N$, to the target PCBs $206_1, \ldots, 206_N$, respectively. The frequency of each of the repeated signals $212_1, \ldots, 212_N$ may be controlled based on the target PCBs $206_1, \ldots, 206_N$ and/or based on the environment in which the signals $212_1, \ldots, 212_N$ may be transmitted. In this regard, the frequency of the received signal 210 may be shifted to match the receive frequencies of the target PCBs $206_1, \ldots, 206_N$ and/or to mitigate any sort of interference such as avoiding avoid noisy frequencies. Additionally, the repeated signals $212_1, \ldots, 212_N$ may be directed to the destination target PCBs $206_1, \ldots, 206_N$. In this regard, the repeated signals $212_1, \ldots, 212_N$ may each comprise a plurality of signal components transmitted via a corresponding plurality of antenna elements and the phase and/or amplitude of the signal components may be controlled to affect the directionality of each of the transmitted signals $212_1, \ldots, 212_N$.

Figure 3:
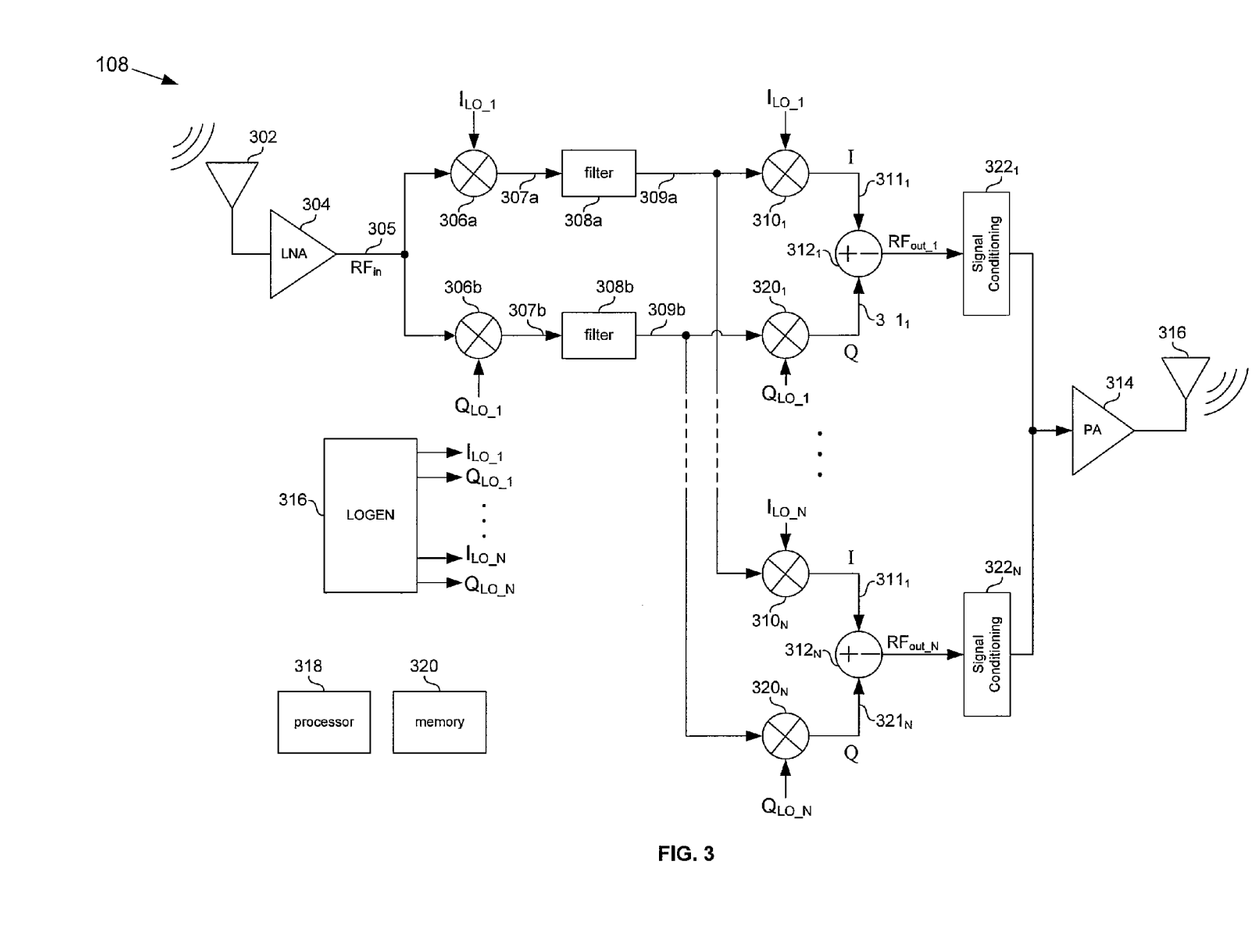
FIG. 3 is a diagram of an exemplary multilink frequency shifting repeater, in accordance with an embodiment of the invention.

FIG. 3 is a diagram of an exemplary frequency shifting repeater, in accordance with an embodiment of the invention. Referring to FIG. 3, the repeater 204 may comprise a low noise amplifier (LNA) 304; mixers 306a, 306b, $310_1, \ldots, 310_N$, and $320_1, \ldots, 320_N$; filters 308a and 308b; adders $312_1, \ldots, 312_N$; power amplifier (PA) 314; signal conditioning blocks $322_1, \ldots, 322_N$; local oscillator generator (LOGEN) 316; processor 318; and memory 320, where N may be the number of target PCBs to which a received signal may be repeated. The repeater 204 may comprise or be communicatively coupled to antennas 302 and 316.

The antennas 302 and 316 may be suited for transmitting and/or receiving EHF signals. In various embodiments of the invention, the antennas may be printed or etched onto the PCB 104. For example, then antennas 302 and 316 may be an array of microstrip patches.

The LNA 304 may comprise suitable logic, circuitry, and/or code that may enable buffering and/or amplification of received RF signals. In this regard, the gain of the LNA 304 may be adjustable to enable reception of signals of varying strength. Accordingly, the LNA 304 may receive one or more control signals from the processor 318 and/or the memory 320.

The mixers 306a and 306b may each comprise suitable logic, circuitry, and/or code that may enable generation of inter-modulation products resulting from mixing the received signal $RF_{IN}$ with the in-phase local oscillator (LO) signal $I_{LO\_1}$ and the quadrature-phase LO signal $Q_{LO\_1}$, respectively. Similarly, the mixers $310_k$ and $320_k$, where k may be an integer between 1 and N, may each comprise suitable logic, circuitry, and/or code that may enable generation of inter-modulation products resulting from mixing the filter outputs 309a and 309b with $I_{LO\_k}$ and $Q_{LO\_k}$, respectively.

The filters 308a and 308b may each comprise suitable, logic, and/or code that may enable passing frequencies at or near a desired intermediate frequency (IF) and attenuating other frequencies. In this regard, the IF may be given by $f_{305}-f_{LO1}$, where $f_{305}$ may be the frequency of the signal 305 output by the LNA 304 and $f_{LO1}$ may be the frequency of the LO signal pair $I_{LO\_1}, Q_{LO\_1}$ output by the LOGEN 316. In various embodiments of the invention, the bandwidth, attenuation, and/or center frequency of each of the filters 308a and 308b may be adjustable based on one or more control signals. Accordingly, the filters 308a and 308b may each receive one or more control signals from the processor 318 and/or the memory 320.

The adders $312_1, \ldots, 312_N$ may each comprise suitable logic, circuitry, and/or code for adding or subtracting signals. In this regard, the adder $312_k$, may be enabled to add signal $311_k$ to signal $321_k$, subtract signal $311_k$ from signal $321_k$ and/or subtract signal $311_k$ from signal $321_k$ In this regard, the adder $312_k$ may receive one or more control signals to determine whether addition or subtraction is performed. Furthermore, the selection of addition or subtraction may depend on the phasing and/or polarity of the signals $I_{LO\_k}, Q_{LO\_k}$, 309a, and 309b. For example, $I_{LO\_k}$ may be $\cos(\omega_{LO\_k}t)$ and $Q_{LO\_k}$ may be $\sin(\omega_{LO\_k}t)$ and addition may be selected such that the output of the adder $312_k$ may be $\cos(\omega_{IF}t-\omega_{LO\_k}t)$, where $\omega_{IF}=\omega_{RFin}-\omega_{LO\_1}$. Alternatively, $I_{LO\_k}$ may be $\cos(\omega_{LO\_k}t)$ and $Q_{LO\_k}$ may be $-\sin(\omega_{LO\_k}t)$ and subtraction may be selected such that the output of the adder $312_k$ may be $\cos(\omega_{IF}t-\omega LO\_k t)$, where $\omega_{IF}=\omega_{RFin}-\omega_{LO\_1}$.

The PAs 314a and 314b may each comprise suitable logic, circuitry, and/or code that may enable buffering and/or amplification of an RF signal and outputting the signal to an antenna for transmission. In this regard, the gain of the PAs 314a and 314b may be adjustable and may enable transmitting signals of varying strength. Accordingly, the PAs 314a and 314b may receive one or more control signals from the processor 318 and/or the memory 320.

The LOGEN 316 may comprise suitable logic, circuitry, and/or code that may enable generating local oscillator (LO) signal pairs $I_{LO\_1}, Q_{LO\_1}, \ldots, I_{LO\_k}, Q_{LO\_k}$. In various embodiments of the invention, the signal generator 316 may comprise, for example, one or more VCO's, PLLs, and/or direct digital frequency synthesizers (DDFSs). The frequency of the LO signals output by the LOGEN 316 may be determined based on one or more control signals from the processor 318 and/or the memory 320.

The processor 318 may comprise suitable logic, circuitry, and/or code that may enable control and/or data processing operations for the repeater 108. For example, the processor 318 may provide one or more control signals for configuring the filters 308 and/or the LOGEN 316.

The memory 320 may comprise suitable logic, circuitry, and/or code that may enable storage of data and/or other information utilized by the repeater 108. In this regard, the processor may be enabled to store received data and/or information for configuring and/or operating the repeater 108. For example, the memory 320 may store information for configuring the filters 308 and/or the LOGEN 316.

In operation, a signal may be received via the antenna 302 and amplified by the LNA 304 to generate the signal $RF_{in}$. The mixers 306a and 306b may mix $RF_{in}$ with the LO signal pair $I_{LO\_1}, Q_{LO\_1}$. In this regard, the processor 318 and/or the memory 320 may provide one or more signals for controlling the frequency of the the LO signal pair $I_{LO\_1}, Q_{LO\_1}$ output by the LOGEN 316. The filters 308a and 308b may filter the output of the mixers 306a and 306b to generate intermediate frequency (IF) signals 309a and 309b. In this regard, the processor 318 and/or the memory 320 may provide one or more signals for controlling the response of the filters 308a and 308b. The mixers $310_k$ and $320_k$ may mix the IF signals 309a and 309b with the LO signal pair $I_{LO\_k}, Q_{LO\_k}$ to generate signals $311_k$ and $311_k$. The adder $312_k$ may add or subtract the signals $311_k$ and $311_k$ to generate $RF_{out\_k}$. In this manner, $RF_{out\_k}$ may be generated by frequency shifting $RF_{in}$ by $-(f_{LO\_1}+f_{LO\_k})$, where $f_{LO\_1}$ is the frequency of the LO signal pair $I_{LO\_1}, Q_{LO\_\setminus 1k}$ and $f_{LOk}$ is the frequency of the LO signal pair $I_{LO\_k}, Q_{LO\_k}$ output by the LOGEN 316. Accordingly, signals received via the antenna 302 may be repeated to k target PCBs on k frequencies via the antenna 316. Additional details of operation of the repeater 204 may are described below with respect to FIG. 4.

Figure 4:
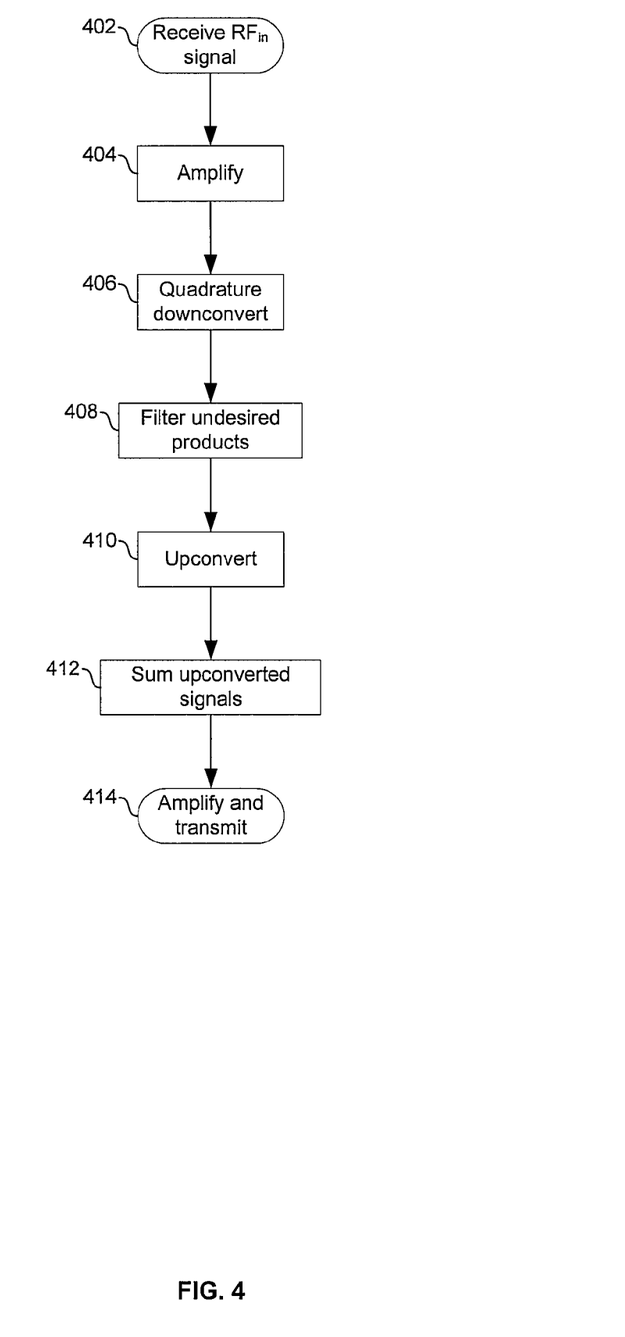
FIG. 4 is a flow chart illustrating exemplary operation of a multilink frequency shifting repeater, in accordance with an embodiment of the invention.

FIG. 4 is a flow chart illustrating exemplary operation of a frequency shifting repeater, in accordance with an embodiment of the invention. Referring to FIG. 4 the exemplary steps may begin with step 402 when a signal may be received by the repeater 108. Subsequent to step 402, the exemplary steps may advance to step 404.

In step 404, the received RF signal may be amplified by the low noise amplifier 304. Subsequent to step 404, the exemplary steps may advance to step 406.

In step 406, the amplified RF signal 305 output by the LNA 304 may be quadrature down converted. In this regard, the mixer 306a may mix the signal 305 with an in-phase local oscillator signal, $I_{LO\_1}$, and the mixer 306b may mix the signal 305 with a quadrature-phase local oscillator signal, $Q_{LO\_1}$. Subsequent to step 406, the exemplary steps may advance to step 408.

In step 408, the signals 307a and 307b output by the mixers 306a and 306b may be filtered to remove undesired mixer products. In this regard, the filter 308a may low pass filter the signal 307a and output $\cos(\omega_{RF}-\omega_{LO\_1})$ and the filter 308b may low pass filter the signal 307b and output $\sin(\omega_{RF}-\omega LO_{\_1})$. Subsequent to step 408, the exemplary steps may advance to step 410.

In step 410, the filtered signals 309a and 309b may be up-converted. In this regard, the mixer $310_k$ may mix the signal 309a with the in-phase local oscillator signal $I_{LO\_k}$ signal to generate $311_k$ and the mixer $320_k$ may mix the signal 309b with the quadrature-phase local oscillator signal $Q_{LO\_k}$ to generate $321_k$. Subsequent to step 410, the exemplary steps may advance to step 412.

In step 412, the adder $312_k$ may add or subtract the up-converted signals $311_k$ and $321_k$ to generate the $RF_{out\_k}$ signal. Accordingly, $RF_{out\_k}$ may be frequency shifted relative to the $RF_{in}$ signal by an amount equal to (within a tolerance) $-(f_{LO\_1}+f_{LO\_k})$. For example, if $RF_{in}$ is 61 GHz, $f_{LO\_1}$ is 250 MHz, and $f_{LO\_k}$ is 150 MHz then $RF_{out\_k}$ may be 60.6 GHz. In this manner, a received signal may be repeated on a different frequency than the frequency on which it is received. In this regard, the frequency of the transmitted signal $212_k$ may be determined based, for example, on a frequency of operation of the target PCB $206_k$ and/or noise present in and/or around the repeater 108. Subsequent to step 412, the exemplary steps may advance to step 413.

In step 413, the signal $RF_{out\_k}$ may be conditioned by the signal conditioning block $322_k$ such that the repeated signal $212_k$ may be directed at the target device $206_k$. In this regard, the signal conditioning block $322_k$ may adjust a phase and/or amplitude of one or more components of the signal $RF_{out\_k}$. Subsequent to step 413, the exemplary steps may advance to step 414.

In step 414, $RF_{out\_k}$ may be amplified by the PA 314 and transmitted via the antenna 316 to the target device $212_k$. In this manner, a repeater may repeat an EHF signal to a plurality of target PCBs, wherein each of the target devices may be in a different physical location and/or operating on a different frequency.

Thus, aspects of a method and system for inter-PCB communication utilizing a spatial multi-link repeater are provided. In this regard, a signal 210 may be transmitted between printed circuit boards 202, 204, and 206 via one or more repeaters 108, wherein the repeaters 108 may frequency shift received signals 210 to generate repeated signals 212. Each of the repeated signals 212 may be generated by quadrature down-converting said received signal by mixing, via mixers 306, the received signal with a first LO signal pair, up-converting the down-converted signal by mixing, via mixers 310 and 320, it with a second LO signal pair, and adding or subtracting, via a adder/subtractor 312, an in-phase portion 311 and a quadrature-phase portion 321 of the up-converted signal. Each repeated signal 212 may comprise one or more signal components and a phase and/or amplitude of each of the components may be controlled, via a signal conditioning block 322, to control a directivity of the repeated signals 212. The repeater 108 may reside on one of the plurality of printed circuit boards 204. In this regard, the circuit board 204 may comprise logic, circuitry, and/or code for extracting and/or processing information from the received signal 310. The repeater 108 may receive and/or transmit signals via one or more antennas 302 and 316 fabricated in and/or on the printed circuit board 204. For example, the repeater may transmit and/or receive via one or more microstrip patch array antennas. Various circuit boards 202, 204, and/or 206 may receive on different frequencies and/or be in different physical locations. Accordingly, an amount by which to frequency shift a signal may be determined based on a target PCB of the signal. Furthermore, a frequency of one or more LO signal pairs may be determined based on a amount of frequency shift to be applied.

Another embodiment of the invention may provide a machine-readable storage, having stored thereon, a computer program having at least one code section executable by a machine, thereby causing the machine to perform the steps as described herein for inter-PCB communication utilizing a spatial multi-link repeater.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   on a first printed circuit board, said first printed circuit board comprising a repeater operable to communicate with a transmitter and/or receiver on each of a plurality of second printed circuit boards;
   receiving, at said first printed circuit board, a signal from a first of said plurality of second printed circuit boards;

determining, by said first printed circuit board, which one or more of said second printed circuit boards said received signal is destined for;

transmitting, by said first printed circuit board, a repeated signal for each of said one or more of said second printed circuit boards that said signal is destined for;

receiving, by said first printed circuit board, a message from each of said one or more of said second printed circuit boards via a control connection between said first printed circuit board and each of said one or more of said second printed circuit boards;

wherein:
each said repeated signal carries the same information as said first signal;
each said repeated signal is frequency shifted with respect to said first signal; and
each said repeated signal comprises one or more signal components, and wherein said first printed circuit board adjusts a phase and/or amplitude of each of said one or more signal components to control a directivity of each said repeated signal based on each said message received via said control connection corresponding to each of said one or more of said second printed circuit boards.

2. The method according to claim 1, wherein said generation of each said repeated signal comprises quadrature down-converting said received signal by mixing said received signal with a first of a plurality of phase-quadrature local oscillator signal pairs.

3. The method according to claim 2, wherein said generation of each said repeated signal comprises up-converting said down-converted signal by mixing said down-converted signal with a second pair of said plurality of phase-quadrature local oscillator signal pairs.

4. The method according to claim 3, wherein said generation of each said repeated signal comprise adding or subtracting an in-phase portion of said up-converted signal with a quadrature-phase portion of said up-converted signal.

5. The method according to claim 1, wherein said first printed circuit boards comprises logic, circuitry, and/or code for extracting and/or processing information from said received signal.

6. The method according to claim 1, wherein said transmitting and said receiving is via one or more antennas fabricated in and/or on said first printed circuit board.

7. The method according to claim 6, wherein each of said one or more antennas is an array of microstrip patches.

8. The method according to claim 1, wherein a first portion of said plurality of second printed circuit boards receive signals on a frequency that is different than a frequency on which a second portion of said plurality of second printed circuit boards receive signals.

9. The method according to claim 1, wherein a first portion of said plurality of second printed circuit boards is in a different physical location than a remaining portion of said plurality of second printed circuit boards.

10. The method according to claim 1, comprising determining, for each said repeated signal, an amount by which said repeated signal is frequency shifted with respect to said first received signal based on which one of said plurality of second printed circuit boards that said repeated signal is destined for.

11. The method according to claim 4, comprising selecting between said adding and said subtracting based on which one of said plurality of second printed circuit boards that said repeated signal is destined for.

12. A system for signal processing, the system comprising:
one or more circuits for use on a first printed circuit board, said one or more circuits comprising a repeater operable to communicate with a transmitter and/or receiver on each of a plurality of second printed circuit boards, and said one or more circuits being operable to:
receive, at said first printed circuit board, a signal from a first of said plurality of second printed circuit boards;
determine, by said first printed circuit board, which one or more of said second printed circuit boards said received signal is destined for;
transmit, by said first printed circuit board, a repeated signal for each of said one or more of said second printed circuit boards that said signal is destined for;
receive, by said first printed circuit board, a message from each of said one or more of said second printed circuit boards via a control connection between said first printed circuit board and each of said one or more of said second printed circuit boards;
wherein:
each said repeated signal carries the same information as said first signal;
each said repeated signal is frequency shifted with respect to said first signal; and
each said repeated signal comprises one or more signal components, and wherein said first printed circuit board adjusts a phase and/or amplitude of each of said one or more signal components to control a directivity of each said repeated signal based on each said message received via said control connection corresponding to each of said one or more of said second printed circuit boards.

13. The system according to claim 12, wherein said generation of each said repeated signal comprises quadrature down-conversion of said received signal by mixing said received signal with a first of a plurality of phase-quadrature local oscillator signal pairs.

14. The system according to claim 13, wherein said generation of each said repeated signal comprises up-conversion of said down-converted signal by mixing said down-converted signal with a second pair of said plurality of phase-quadrature local oscillator signal pairs.

15. The system according to claim 14, wherein said generation of each said repeated signal comprises addition or subtraction of an in-phase portion of said up-converted signal with a quadrature-phase portion of said up-converted signal.

16. The system according to claim 12, wherein said first printed circuit boards comprises logic, circuitry, and/or code for extracting and/or processing information from said received signal.

17. The system according to claim 12, wherein said transmitting and said receiving is via one or more antennas fabricated in and/or on a printed circuit board.

18. The system according to claim 17, wherein each of said one or more antennas is an array of microstrip patches.

19. The system according to claim 12, wherein a first portion of said plurality of second printed circuit boards receive signals on a frequency that is different than a frequency on which a second portion of said plurality of second printed circuit boards receive signals.

20. The system according to claim 12, wherein a first portion of said plurality of second printed circuit boards is in a different physical location than a remaining portion of said plurality of second printed circuit boards.

21. The system according to claim 12, wherein said one or more circuits are operable to determine, for each said repeated signal, an amount by which said repeated signal is frequency shifted with respect to said received signal based on which one of said plurality of second printed circuit boards that said repeated signal is destined for.

22. The system according to claim 21, wherein said one or more circuits that enable determination of a frequency of one or more of said plurality of phase quadrature local oscillator signal pairs are operable to select between said adding and said subtracting based on said determined amount by which to shift said first signal which one of said plurality of second printed circuit boards that said repeated signal is destined for.

* * * * *